United States Patent
Damodaran et al.

(10) Patent No.: US 8,970,267 B2
(45) Date of Patent: Mar. 3, 2015

(54) ASYNCHRONOUS CLOCK DIVIDERS TO REDUCE ON-CHIP VARIATIONS OF CLOCK TIMING

(75) Inventors: Raguram Damodaran, Plano, TX (US); Abhijeet Ashok Chachad, Plano, TX (US); Ramakrishnan Venkatasubramanian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/874,627

(22) Filed: Sep. 2, 2010

(65) Prior Publication Data
US 2013/0176060 A1   Jul. 11, 2013

(51) Int. Cl.
  *H03K 21/00* (2006.01)
  *H03K 23/00* (2006.01)
  *H03K 25/00* (2006.01)
  *H03K 23/42* (2006.01)

(52) U.S. Cl.
  CPC .............. *H03K 25/00* (2013.01); *H03K 23/42* (2013.01)

USPC ........... 327/115; 327/113; 327/117; 327/291; 327/298; 327/299

(58) Field of Classification Search
  CPC .......... H03K 5/135; G06F 1/10; G11C 7/222
  USPC .................. 327/113, 115, 117, 291, 298, 299
  See application file for complete search history.

(56) References Cited

U.S. PATENT DOCUMENTS 5,532,633 A * 7/1996 Kawai ........................... 327/174
2006/0091928 A1 * 5/2006 Kapur ........................... 327/298

* cited by examiner

*Primary Examiner* — John Poos
(74) *Attorney, Agent, or Firm* — Robert D. Marshall, Jr.; Frederick J. Telecky, Jr.

(57) ABSTRACT

This invention is a means to definitively establish the occurrence of various clock edges used in a design, balancing clock edges at various locations within an integrated circuit. Clocks entering from outside sources can be a source of on-chip-variations (OCV) resulting in unacceptable clock edge skewing. The present invention arranges placement of the various clock dividers on the chip at remote locations where these clocks are used. This minimizes the uncertainty of the edge occurrence.

4 Claims, 5 Drawing Sheets

US 8,970,267 B2

ASYNCHRONOUS CLOCK DIVIDERS TO REDUCE ON-CHIP VARIATIONS OF CLOCK TIMING

TECHNICAL FIELD OF THE INVENTION

The technical field of this invention is clock timing circuits.

BACKGROUND OF THE INVENTION

VLSI hardware modules designed to be used in a variety of products have become increasingly important as the complexity and cost of designing complex products has increased. Texas Instruments has recently labeled such modules as generic engineering modules (GEM). In these modules there are multiple clock domains allowing for operation of various parts of the chip at frequencies optimized for speed and power dissipation trade-off. Multiple clocks entering a GEM megamodule, although synchronous to each other, can cause on-chip variations (OCV) also known as clock skew.

Clock dividers used to generate the optimized frequency clock signals typically reside as separate hardware blocks adjacent to a centrally located phase-locked loop (PLL). This commonly used technique establishes tight control over the occurrence of clock edges at multiple frequencies. These clock dividers issue clocks to the various domains within the GEM. The GEM is subject to OCV issues having to do with clock balancing (skew reduction) and static-timing analysis (STA) closure difficulties.

FIG. 1 illustrates a typical prior art design using multiple frequency clocks that are either the PLL clock frequency or a sub-multiple of the PLL clock frequency. Four possible clocks are shown in FIG. 1 and are described below.

In prior art, clock dividers 112, 113 and 114 often reside at a central location near the PLL and within the megamodule. These dividers generate sub-multiple frequency clocks supplementing the highest speed clock coming directly from PLL 101 via delay element 102. Normally one or more clocks generated by dividing the PLL clock down to sub-multiples of the PLL clock are needed to optimize the design for speed and power dissipation. Test clock input (TCK) 131 allows use of test clock to be substituted for the free-running PLL-based clocks during test operations. FIG. 1 illustrates PLL clock and three sub-multiple clocks. These are: PLL frequency clock 121; PLL frequency divided by two clock 122; PLL frequency divided by three clock 123; and PLL frequency divided by four clock 124.

Synchronization of these clocks is controlled by signals from outside the GEM, which guarantees that each clock starts at the identical time. FIG. 4 shows possible non-synchronous clocks that are possible when simple frequency division is implemented. Because the clocks reside physically inside GEM, it is straightforward to control the required clock enables for three different clocking modes: internal clock; external clock; and design-for-test (DFT).

FIG. 1 also illustrates sub-module 150 accepting divide-by-two clock 122 and sub-module 156 accepting divide-by-four clock 124. Delay element 132 provides a delayed version of clock 122 for clocked elements 151 and 152. Delay element 134 provides a delayed version of clock 124 for clocked elements 154 and 155. Delay elements 130 through 134 inject supplemental delays in their respective clock paths allowing additional minor adjustment to establish the timing balance between sub-modules. Possible paths for the PLL frequency clock with delay element 130 and divide-by-three clock divider 113 with delay element 133 are shown as unused in this example.

SUMMARY OF THE INVENTION

This invention definitively establishes the occurrence of various clock edges used in a design, balancing clock edges at various locations within the chip. Clocks entering a chip from outside sources can be a source of on-chip-variations (OCV) resulting in unacceptable clock edge skewing. The present invention arranges placement of the various clock dividers at remote locations on the chip minimizing uncertainty of the edge occurrence. These special purpose clock dividers often reside at multiple locations within the GEM. They generate the highest speed clock coming directly from the PLL and one or more local clocks by dividing the PLL clock down to sub-multiples. The synchronization of the clocks is controlled by signals from outside the GEM. This guarantees that each clock starts at a tightly controlled time. Because the clocks are distributed at the remote points-of-use physically inside GEM, it is straightforward to control the required clock enables for different modes: functional; and design-for-test (DFT).

BRIEF DESCRIPTION OF THE DRAWINGS

These and other aspects of this invention are illustrated in the drawings, in which.

DETAILED DESCRIPTION OF PREFERRED EMBODIMENTS

The GEM clock dividers of the present invention are designed to support the following features: Alignment at power-up reset (POR); EFUSE Programmable chain divider ratio, tie-off or EFUSE switching; Design for Test (DFT) clock shaper support; CATSCAN support; and Test-mode support. GEM dividers continue to run even when their outputs are gated off.

Figure 2:
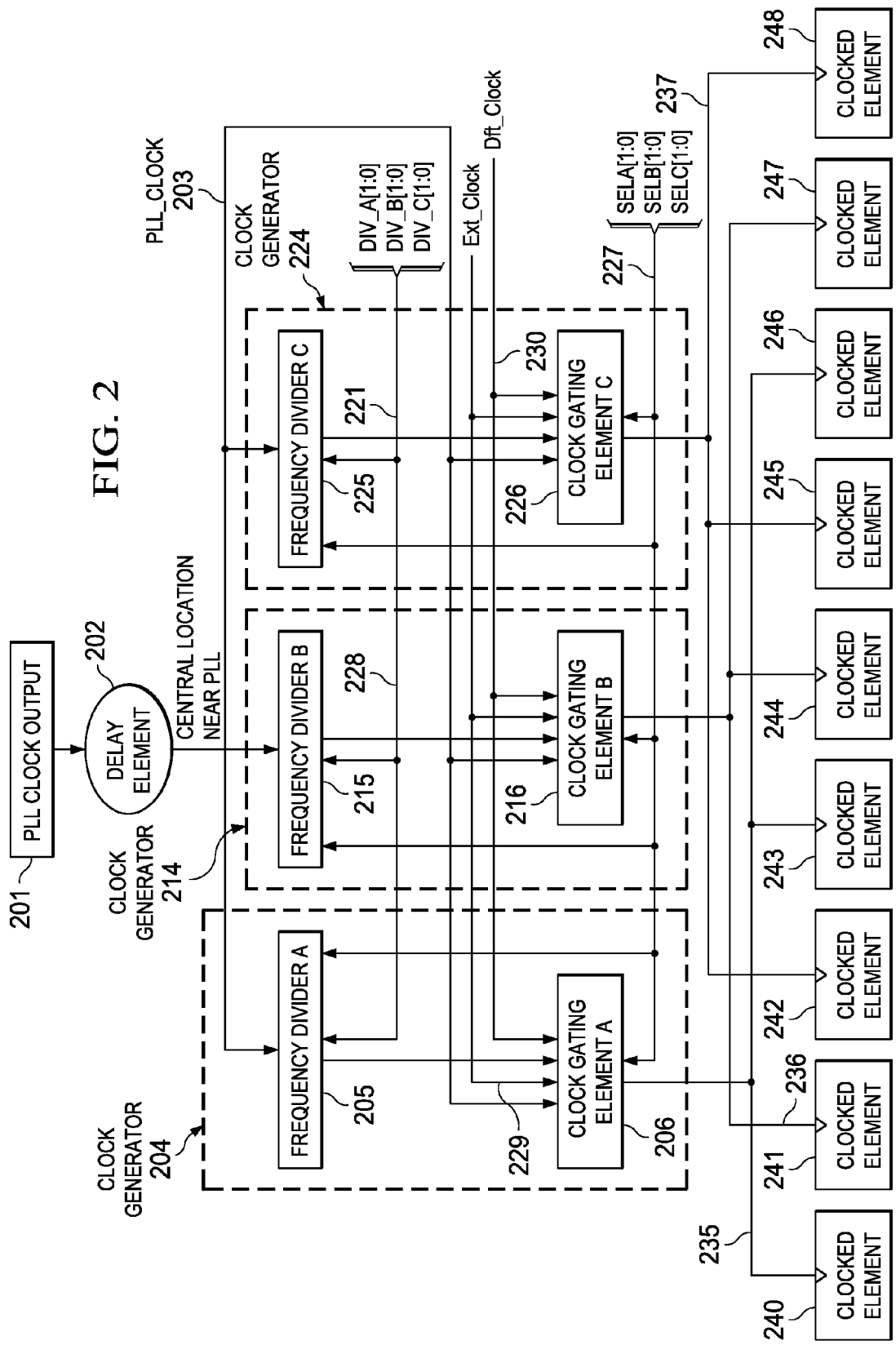
FIG. 2 illustrates the clock divider/distribution system of this invention with frequency dividers at remote locations where the specific frequency clocks are to be used.

FIG. 2 illustrates the clock divider/distribution system of this invention having frequency dividers at remote locations where the specific frequency clocks are to be used. The highest speed clock comes directly from the PLL via output 201 and delay element 202. FIG. 2 illustrates three example GEM clock generators 204, 214 and 224. Each clock generator sub-module contains special purpose, remotely located, programmable dividers 205, 215 and 225. Clock generator 204 accepts PLL clock 203 and generates clock 235 which is one scaled down version of PLL clock 203. Divide-by-two, divide-by-three or divide-by-four are possible programming choices in the preferred embodiment. Clocks 235, 236 and 237 represent the three programmable clock outputs from respective frequency dividers 205, 215 and 225. Clock 235 supplies clocked elements 240, 243 and 246. Clock 236 supplies clocked elements 241, 244 and 247. Clock 237 supplies clocked elements 242, 245 and 249. Clock generator 214 accepts PLL clock 203 and is programmed to generate clock 236 which is another scaled down version of PLL clock 203. Clock generator 224 generates clock 237 which is a third scaled down version of PLL clock 203.

Each clock generator module contains two major blocks: respective programmable frequency dividers 205, 215 and 225; and respective clock gating elements 206, 216 and 226. Input signals to each clock generator include: PLL clock 203; corresponding two bit divide ratio command Div_A[1:0], Div_B[1:0] and Div_C[1:0] coded as according to Table 1; and corresponding two bit selection signals SELA[1:0], SELB[1:0] and SELC[1:0] coded according to Table 2.

Figure 1:
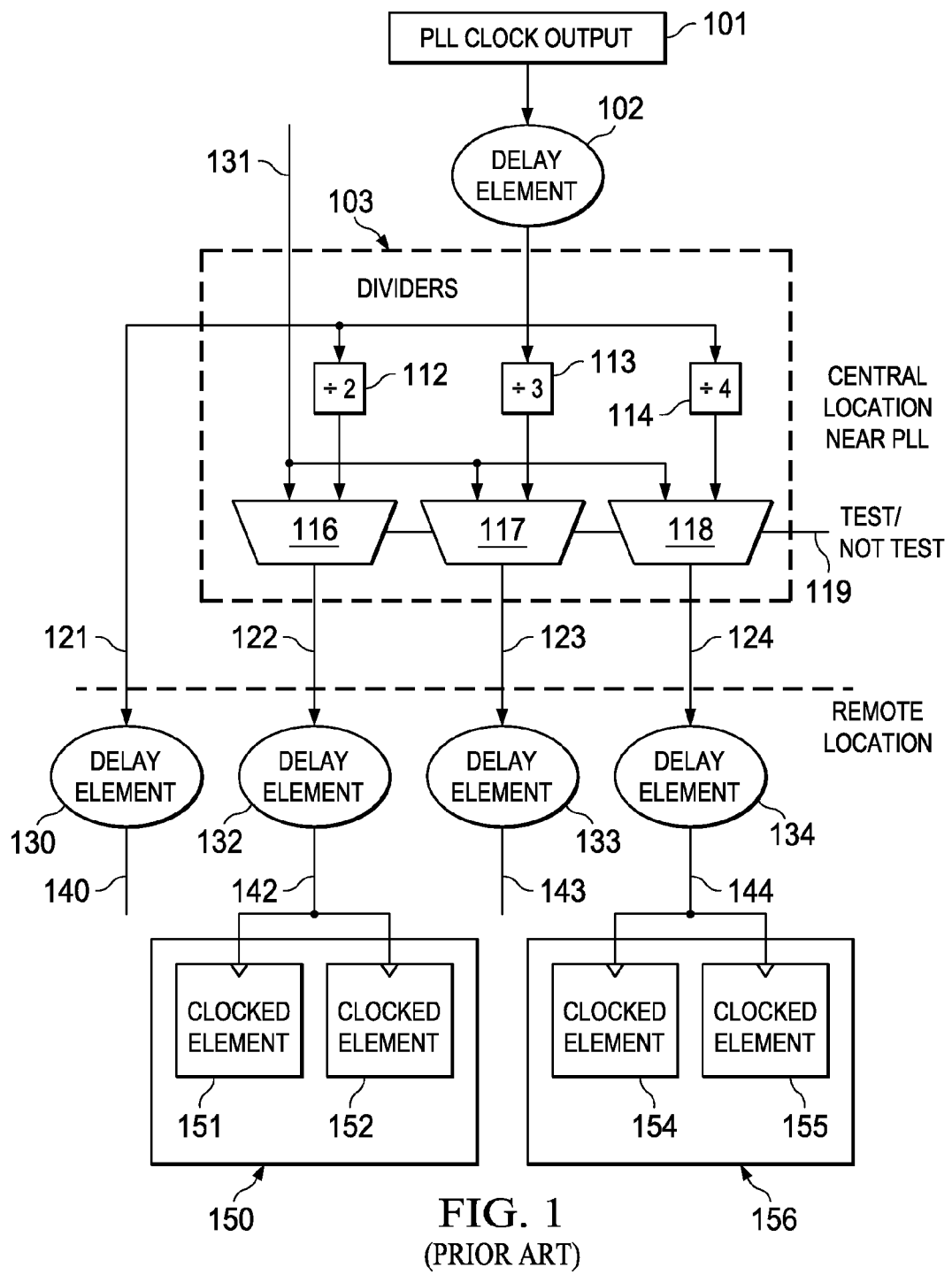
FIG. 1 illustrates a typical prior art design using frequency dividers at a central location from which specific frequency clocks are distributed to the locations at which they are used (Prior Art)

The clocking system of the present invention illustrated in FIG. 2 differs from the prior art illustrated in FIG. 1. In FIG. 2 the programmable dividers (204, 214 and 224) are located remotely from PLL clock output 201. This allows the design to be adjusted specifically for the needs of remote hardware at various locations within the chip.

Table 1 lists the coding of the two bit divide ratio commands Div_A[1:0], Div_B[1:0] and Div_C[1:0]. As illustrated in FIG. 2 one such two-bit code is supplied to each clock generator. The three commands Div_A[1:0], Div_B[1:0] and Div_C[1:0] are coded the same.

TABLE 1

| Div[1:0] | | Function Selected |
| --- | --- | --- |
| 0 | 0 | Not Used |
| 0 | 1 | Divided Clock Active |
| 1 | 0 | External Clock Active |
| 1 | 1 | Test Clock Active |

Table 2 lists the coding for the two bit clock signals SELA[1:0], SELB[1:0] and SELC[1:0]. Note that one such two-bit code is supplied to each clock generator. The three commands SELA[1:0], SELB[1:0] and SELC[1:0] are coded the same.

TABLE 2

| SEL[1:0] | | Function Selected |
| --- | --- | --- |
| 0 | 0 | Not Used |
| 0 | 1 | Divided Clock Active |
| 1 | 0 | External Clock Active |
| 1 | 1 | Test Clock Active |

Figure 3:
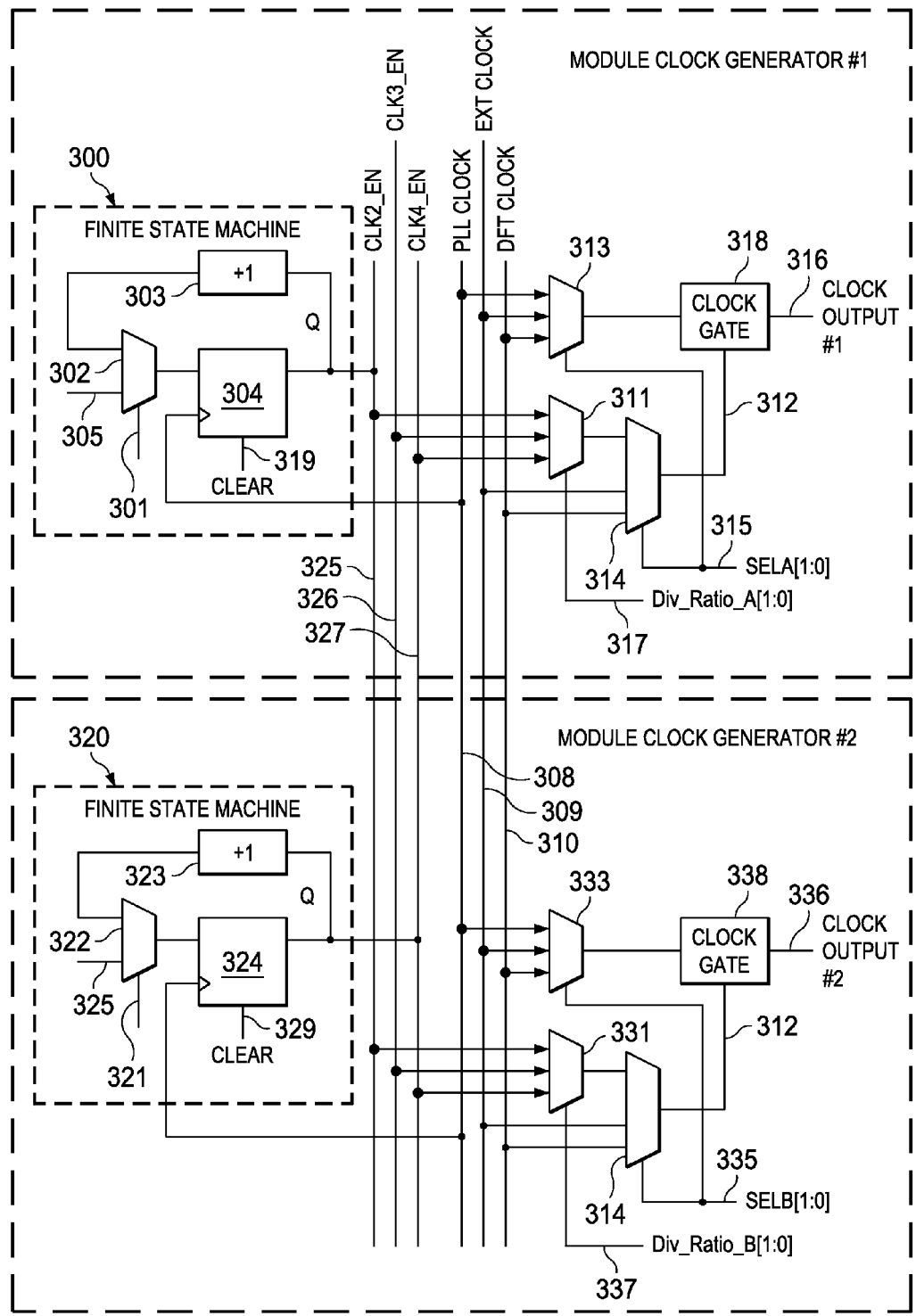
FIG. 3 illustrates two possible channels of clock frequency generation and selection for implementing module clocks at remote locations for superior clock edge control.

FIG. 3 illustrates an example of a special purpose programmable divider logic generating a non-50% duty cycle, pulsed output clock of this invention. The clock insertion delay includes only one clock period on the Q path. This invention eliminates the need for special and complex clock dividers or falling-edge trigged registers by generating a non-50% duty cycle clock. All registers in this invention are rising-edge triggered. Thus the control that generates the enables to the clock gates is not complex. These clock dividers also support boundary scan re-start by initiating the divider output register to a known state.

The required clock frequencies in the divider are generated from one high-speed clock locally by controlling the enable for the clock gate of each clock. On-chip variation in the clock tree is greatly reduced in such an implementation since frequency division is implemented locally.

Finite state machines 300 and 320 generate enables to clock gates 318 and 338, which in turn generate actual clocks 316 and 336. The outputs of these state machines are just control signals [Q] and not the actual clock. The description that follows refers to clock generator 300 at the top of FIG. 3, which generates, as an example, a divide-by-two clock at node 316. Clock generator 320 at the bottom of FIG. 3, which generates as an example, a divide-by-four clock at node 336, is similar.

Register 304 is set to an initial state by a clear signal 319 from the PLL. This signal makes sure that all state machines are in the same initial state. Register 304 is a multiple bit counter, the number of bits depending on the clock that needs to be generated. Multiplexer 302 supplies input data bits to register 304. One input of multiplexer 302 is the output of incrementer 303. The other input 305 is a reset value which is typically the same value used to initialize the state machine. Select signal 301 for multiplexer 302 results from comparison of the register output [Q] and a pre-defined value that depends on the clock to be generated. For example, this value will be "001" to generate a clock whose frequency is PLL clock 203 divided by 2. When the register output [Q] equals this value "001", select signal 301 causes multiplexer 302 to pick input 305 which initializes the register to its reset value. This initial value could be "000." Thus the output Q will toggle between "000" and "001". For a state machine that is responsible for generating PLL clock divided by 3, this sequence will be "000", "001", "010", and then back to "000", the initial state.

Register 304 a bank of registers. The clock input to register 304 is an ungated PLL Clock 308. Each clock feeding modules required in the system will have its own state machine or multiple machines depending on the requirements of the module. For example, a module that requires PLL divided-by-2 clock will have only one such finite state machine generating a single clock functional enable 325.

A module that needs to switch between multiple clocks based on either a tie-off or electrical fuse (effuse) value will have multiple state machines. Each state machine generates a separate enable. As an example, consider a module that requires PLL clock 203 divided by 2, 3 and 4, but requires only one to be active at a time with the flexibility to switch between. This example requires three state machines, each generating a gating output similar to clock functional enable 325. These will be multiplexed based on divider ratio signals Div_Ratio_A 317 or Div_Ratio_B 337.

A large number of such combinations are possible depending on the type and number of state machine and enables employed. These enables are then multiplexed with other enables in the system, which could be a DFT enable, or an enable that requires the module to use an external clock. This is determined by the signal SEL[1:0] 315, which is active when the module is in test mode rather than in functional mode. SEL[1:0] is also active if the clock used by this module is an internally generated clock or an external clock.

The module clock generator function of FIG. 3 is performed by operating on actual clocks PLL_Clock 308, Ext_Clock 309 or DFT_Clock 310 utilizing enables generated in the gating portion of FIG. 3. These enables turn on the clock gating function, passing input clock pulses 308, 309 or 310 to output 316 when enabled. Output 316 is low when the enables are low. The clock pulse input 312 to Clock Gating 318 is the output of multiplexer 314. Multiplexer 314 selects between PLL clock 308, external clock 309 and DFT clock 310 based on module clocking mode SEL[1:0] 315. When multiplexer 313 selects PLL_Clock 308, enable multiplexers 311 and 314 act to generate the required clock output 316.

Figure 4A:
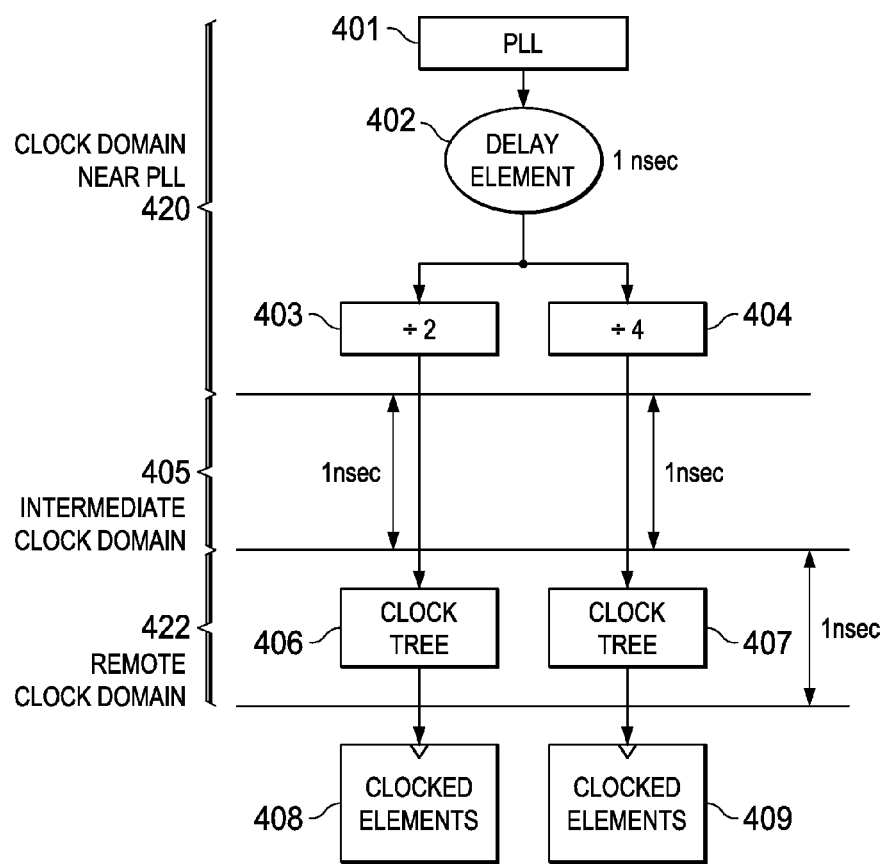
FIG. 4 illustrates a simplified description contrasting the clock paths for prior art versions of clock distribution and the clock distribution technique of the present invention.
Figure 4B:
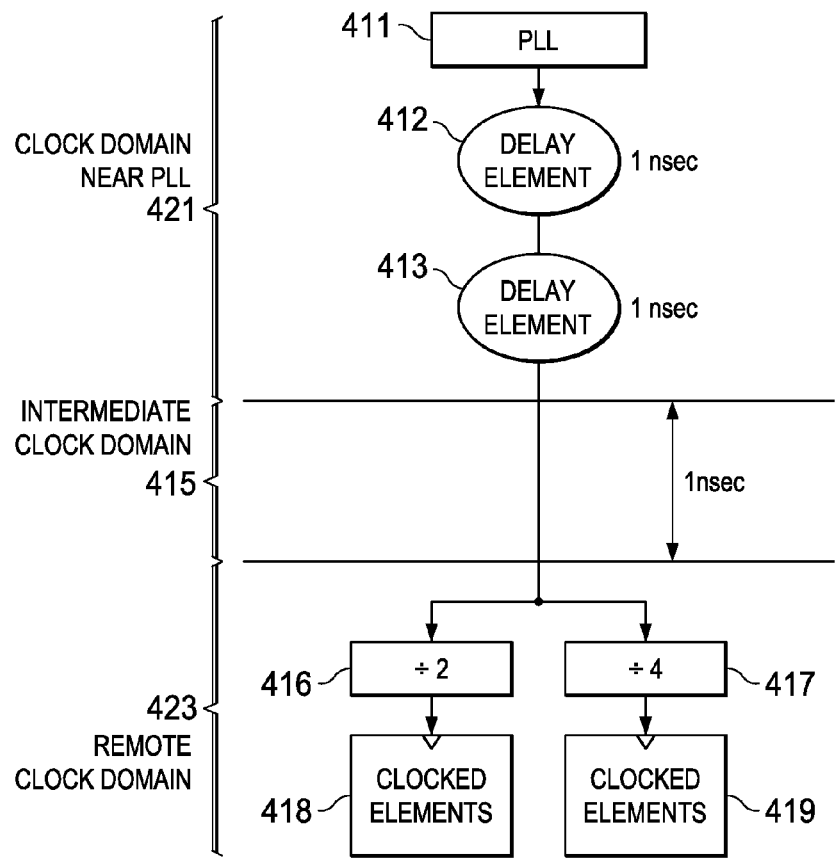

FIG. 4 illustrates a simplified contrast showing the clock paths for a typical prior art version of clock distribution (FIG. 4A) and the clock distribution technique of the present invention (FIG. 4B). In FIG. 4A PLL 401, delay element 402 and dividers 403 and 404 form the clocking source. These are all situated in a clock domain 420 near the PLL. Intermediate clock domain 405 includes paths for div-by-two clock and div-by-four clock. Intermediate clock domain 405 is assumed to have a delay path of 1 nsec. Remote clock domain 422 includes paths for div-by-two clock and div-by-four clock. Remote clock domain 422 is assumed to have a delay path of 1 nsec. Clock trees 406 and 407 distribute clocks as required within remote clock domain 422. Clocked elements 408 and 409 represent the terminal path for the div-by-two clock and the div-by-four clock. The differential paths between 403 and 408 for the div-by-two clock and between 404 and 409 for the div-by-four clock are two units (2 nsec) each. This gives a risk of 10% of that value or 200 psec for clock OCV.

In FIG. 4B PLL 411 and delay elements 412 and 413 are in clock domain near PLL 421. The path delay of the intermediate clock domain 415 (1 nsec) is summed with the delays of delay elements 412 and 413. This introduces no imbalance in the arrival time of active clock edges entering the remote clock domain 423 because there is only one path. Dividers 416 and 417 provide only imbalance in the differential paths for div-by-two clock and div-by-four clock reaching clocked elements 418 and 419 respectively. These paths are well matched by the identical layout of 416 and 417 and their juxtaposition on the chip layout. Table 5 summarizes the results of the prior art approach and the invention approach to reducing OCV. Table 5 lists the clock edge predictability placing programmable dividers near the PLL as in the prior art compared to placing programmable dividers remote from the PLL according to the invention.

TABLE 3

|  | Prior Art | Invention |
| --- | --- | --- |
| Set-Up Time Uncertainty | 10% of Insertion Delay 405 plus 422 200 psec. | Insertion Delay of 416 compared to 417 <<200 psec |
| Hold Time Uncertainty | 10% of Insertion Delay 405 plus 422 200 psec. | Insertion Delay of 416 compared to 417 <<200 psec |

Table 3 shows a reduction in both the set-up time uncertainty and the hold time uncertainty from about 200 psec in the prior art to much less than 200 psec using the invention.

Figure 5:
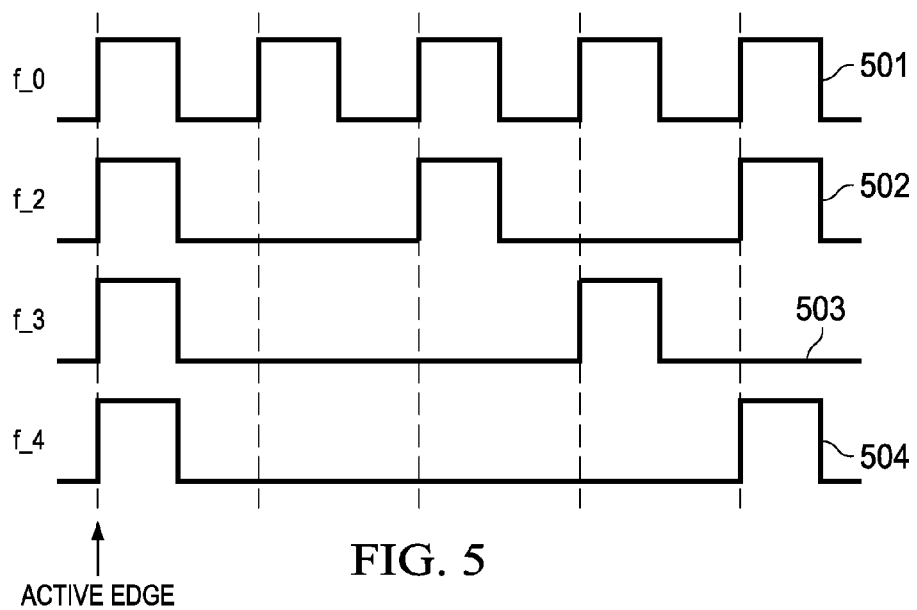
FIG. 5 illustrates the characteristics of the clocks generated by the techniques of the present invention.

FIG. 5 illustrates the characteristics of the clocks generated by the present invention. The duty cycle of the divided clocks is not 50%. The clock structure employed by the present invention reduces the multiple levels of clock multiplexing required to generate and select the different clock frequencies for different modes of operation. All generated clocks f_2 502, f_3 503 and f_4 504 have the active edge an equal number of levels from PLL-based root clock f_0 501. This results in a balanced clock tree by construction.

Since the duty-cycle of the divided clocks is not 50%, two additional requirements must be met in order to use this type of pulse-controlled dividers successfully. These are:

Certain hard-macros (SRAMs) and special cells have clock duty-cycle requirements. Before using this divider implementation, the duty cycle requirement of all the cells should be carefully reviewed; and If negative-edge triggered flops are used in the design, they will essentially be timed at frequency of f_0 501 using this divider implementation.

What is claimed is:

1. An integrated circuit comprising:
a system clock circuit generating a system clock signal;
a plurality of circuit modules disposed on the integrated circuit; and
a plurality of module clock circuits, each clock generator circuit
connected to said system clock circuit for receiving said system clock signal,
connected to a corresponding one of said plurality of circuit modules and supplying a programmable clock signal to said corresponding circuit module,
disposed proximate to said corresponding circuit module and distant from said system clock circuit;
said at least one of said plurality of module clock circuits includes a programmable divider dividing said system clock signal by a programmable integral amount; and
said at least one of said plurality of modules clock circuits includes:
a plurality of finite state machines, each finite state machine having an input connected to said system clock circuit receiving said system clock signal and an output generating a clock gating signal for a predetermined division of said system clock,
a clock gating signal multiplexer having a plurality of inputs, each input connected to a corresponding one of said plurality of finite state machines receiving a corresponding clock gating signal, an output and a control input receiving a clock selection signal, said multiplexer connecting one of said plurality of inputs to said output corresponding to said clock selection signal, and
a clock gate having an input connected to said system clock circuit receiving said system clock, a gating input connected to said output of said multiplexer and an output supplying said programmable clock signal to said corresponding circuit module.

2. The integrated circuit of claim 1, wherein:
each of said finite state machines includes
a multi-bit register having a multi-bit input, a clock input receiving said system clock signal and an multi-bit output;
an incrementer having a multi-bit input connected to said multi-bit output of said multi-bit register and a multi-bit output, said incrementer generating said multi-bit output one greater than said multi-bit input;
a source of a multi-bit reset signal,
a multiplexer having a first input connected to said multi-bit output of said incrementer, a second input connected to said source of a multi-bit reset signal, an output connected to said multi-bit input of said multi-bit register and a control input receiving a control signal, said multiplexer connecting one of said first and second inputs to said output corresponding to said control signal.

3. The integrated circuit of claim 1, further comprising:
at least one integrated circuit input receiving a corresponding external clock signal;
at least one of said plurality of modules clock circuits includes:
a first gating circuit multiplexer having a first input connected to said system clock circuit receiving said system clock signal, at least one second input connected to a corresponding integrated circuit input receiving said corresponding external clock signal, an output connected to said input of said clock gate and a control input receiving a clock selection signal, said first gating multiplexer connecting one of said first and second inputs to said output corresponding to said clock selection signal, and a second gating circuit multiplexer having a first input connected to said output of said clock gating signal multiplexer, at least one second input connected to a corresponding integrated circuit input receiving said corresponding external clock signal, an output connected to said gating input of said clock gate and a control input receiving said clock selection signal, said second gating multiplexer connecting one of said first and second inputs to said output corresponding to said clock selection signal.

4. The integrated circuit of claim 3, wherein:

said at least one integrated circuit input receives a design for test clock signal.

\* \* \* \* \*